United States Patent [19]
Wilkinson

[11] Patent Number: 5,443,860
[45] Date of Patent: Aug. 22, 1995

[54] SEALING METHOD FOR REACTION GASES

[75] Inventor: Thomas F. Wilkinson, Garland, Tex.

[73] Assignee: Texas Instruments Incorporated, Dallas, Tex.

[21] Appl. No.: 204,912

[22] Filed: Mar. 2, 1994

Related U.S. Application Data

[60] Division of Ser. No. 827,780, Jan. 29, 1992, Pat. No. 5,312,490, which is a division of Ser. No. 674,417, Mar. 22, 1991, Pat. No. 5,105,762, which is a continuation of Ser. No. 287,171, Dec. 20, 1988, abandoned.

[51] Int. Cl.⁶ .............................................. C23C 16/00
[52] U.S. Cl. .............................. 427/248.1; 427/255.5; 427/255.7; 216/58

[58] Field of Search ...................... 118/719, 733, 718; 427/248.1, 255.5, 255.7; 156/646

[56] References Cited

U.S. PATENT DOCUMENTS 4,048,955  9/1977  Anderson .......................... 118/719
4,601,260  7/1986  Ovshinsky ......................... 118/718

Primary Examiner—Richard Bueker
Attorney, Agent, or Firm—Christopher L. Maginniss; W. James Brady, III; Richard L. Donaldson

[57] ABSTRACT

Reaction gases are prevented from escaping from a reaction chamber through the use of flexible or gas seals between the interface of the reaction chamber and the junction used to connected successive reaction chambers.

5 Claims, 6 Drawing Sheets

SEALING METHOD FOR REACTION GASES

This is a division, of application Ser. No. 07/827,780, filed Jan. 29, 1992, now U.S. Pat. No. 5,312,490, which is a division of Ser. No. 07/674,417, filed Mar. 22, 1991 (now issued as U.S. Pat. No. 5,105,762), which is a continuation of Ser. No. 07/287,171, filed Dec. 20, 1988 (now abandoned).

FIELD OF THE INVENTION

This invention relates to continuous chemical vapor deposition reactors, and more particularly to improvements in gas seals for such reactors.

BACKGROUND OF THE INVENTION

A continuous chemical deposition reactor may be a stand-alone process system with a continuous semiconductor wafer flow. Basic subsystems in such a system may include a wafer handling, a reaction chamber, a gas flow system, a cooling system, and an electrical system.

The wafer handling system may include wafer loaders and unloaders, wafer carriers, and a track for moving a wafer through the reactor chambers.

The reactor chamber subsystem is the site for processing the semiconductor wafer. Each chamber may include a gas supply inlet, a chamber housing, heat lamps and exhaust.

The gas flow subsystem supplies the reactant gases to each chamber, and may include valves, flow controllers and an exhaust system.

The cooling subsystem assists in maintaining the process temperature and reduces the heat radiation to the surrounding components. Both air flow and water flow may be used in the cooling subsystem.

The electrical subsystem provides subsystem control and powers the reactor, and may include power supplies, motors, sensors, valves, and one or more computer/controller.

A basic reactor and process may be as follows. A semiconductor wafer is loaded onto a carrier which enters one end of the reactor through a port and is moved successively through the various chambers and out the other end of the reactor through another port. The reactor may not be physically closed but has gas seals at each end and in between each chamber of the reactor. As an example, a reactor may include eight chambers in which the first chamber consists of a nitrogen seal, the second chamber is a preheat chamber, the next four chambers may be deposition chambers, then a cool-down chamber and the last chamber is a nitrogen seal. A typical gas supply system may supply gases for two different deposition processes which may be directed into any of the deposition chambers. Each chamber is effectively divided into two portions, a top portion and a bottom portion by the wafer carrier. The junctions between the chambers effectively isolate one chamber from the other by the flow of gases or the exhaust gases from the chambers, and gas flow or seals are used to prevent gases from escaping from the reactor chamber/junction interface.

An example of a prior art continuous chemical vapor deposition reactor may be found in U.S. Pat. No. 4,048,955.

SUMMARY OF THE INVENTION

The invention relates to a multi-chamber continuous chemical vapor deposition reactor and the seals and method of preventing gases from escaping at the reaction chamber/junction interface. The etch and deposition process in the reactor depends upon gas flow through the reactor. The basic process starts when a semiconductor wafer is removed from a wafer cassette by a robotic arm and is placed in a carrier. The carrier may be one of several configurations to accommodate wafers of different diameters. Each carrier may hold one or more wafers, depending upon the diameter of the wafer.

A semiconductor wafer is placed in a carrier and is moved successively through the various chambers and out the end of the reactor. The semiconductor wafer is placed inverted in the carrier and a lid is placed on top. The lid becomes the carrier for radiant heat from incandescent lamp heaters.

Each chamber has an associated heat lamp, gas inlets and outlets, a track on which the wafer carrier is moved, and seals to prevent the gas from escaping to the environment outside the reactor, and to prevent exhaust gases from entering the process chambers. The seal may be a mechanical seal or a pressure differential seal to prevent a gas from entering an area within the reactor or escaping the reactor at points other than the exhaust ports.

The gas inlets may be baffled to cause an even distribution of gas within the reactor, and to prevent unwanted deposition of material on the reactor chamber wall.

Each chamber of the reactor is divided into two regions by the wafer carrier. These two regions are regions above the carrier and below the carrier. The process gas flows through the lower part of the reactor below the carrier and across the exposed semiconductor wafer face.

An inert gas may be directed through the upper region of the reactor to prevent the process gas from entering the upper region and to help provide the gas pressure differential needed to prevent exhaust gasses from entering the process region of the reactor.

The junction between chambers effectively isolates one chamber from the other by the flow of process gases or the exhaust of gas or gases from the chambers. The interfaces between each junction and the reaction chamber on each side require a seal between the interface to prevent gases from escaping into the room in which the reactor is located.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
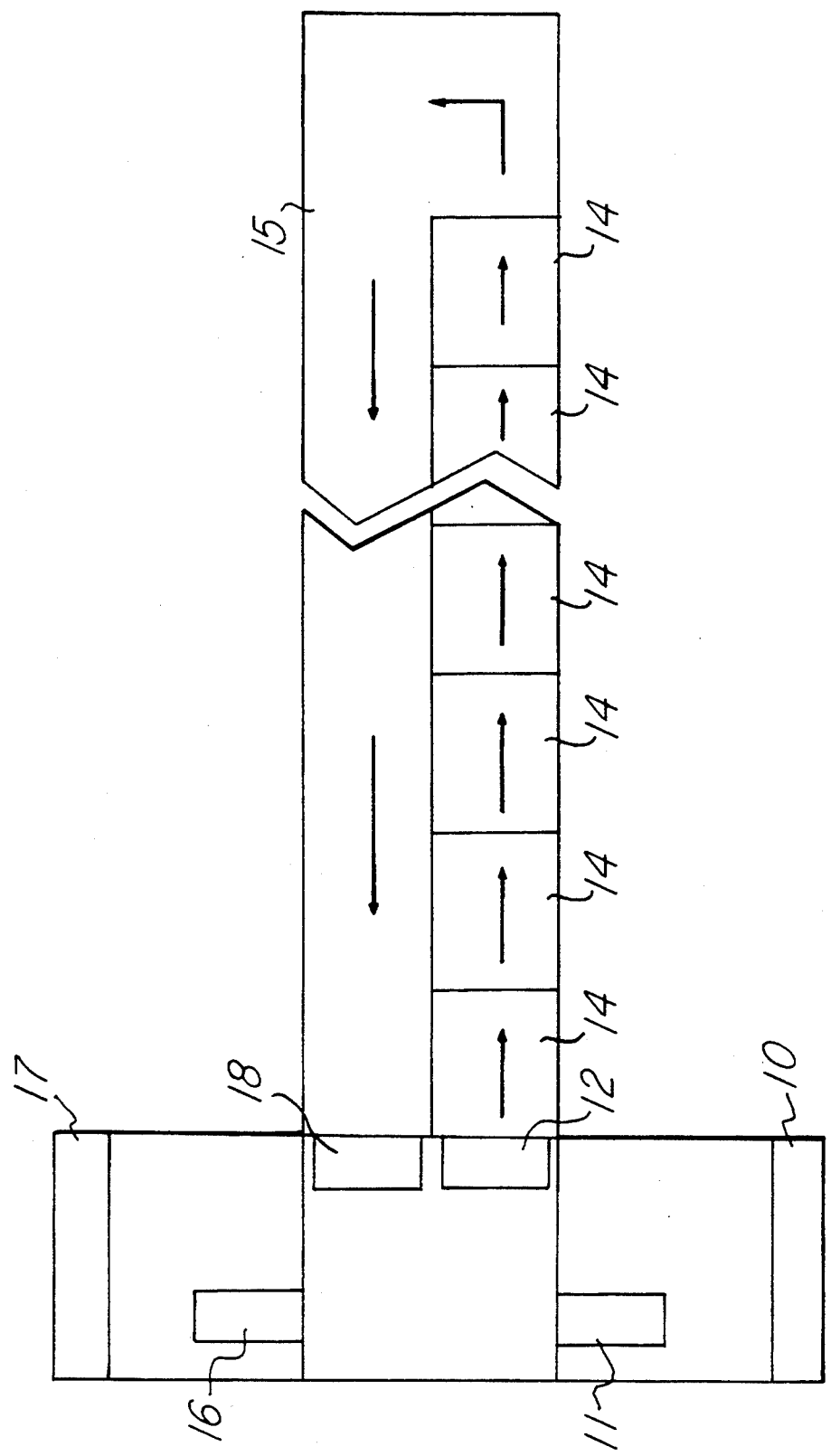
FIG. 1 is a simplified block diagram of the continuous chemical vapor deposition reactor.

FIG. 1 is a block diagram of reactor of the present invention. Semiconductor wafers that are to be processed are loaded into cassettes 10. A robotic arm 11 removes a wafer from the cassette and places it in a carrier which enters the reactor at 12, and then is moved through a plurality of process chambers 14 to the end of the reactor where it enters a return path 15. The semiconductor wafer in the carrier is moved through return path 15 to an unload station 18. At unload station 18 the wafer is removed from the carrier by robotic arm 16 and place in a cassette at 17.

Figure 2:
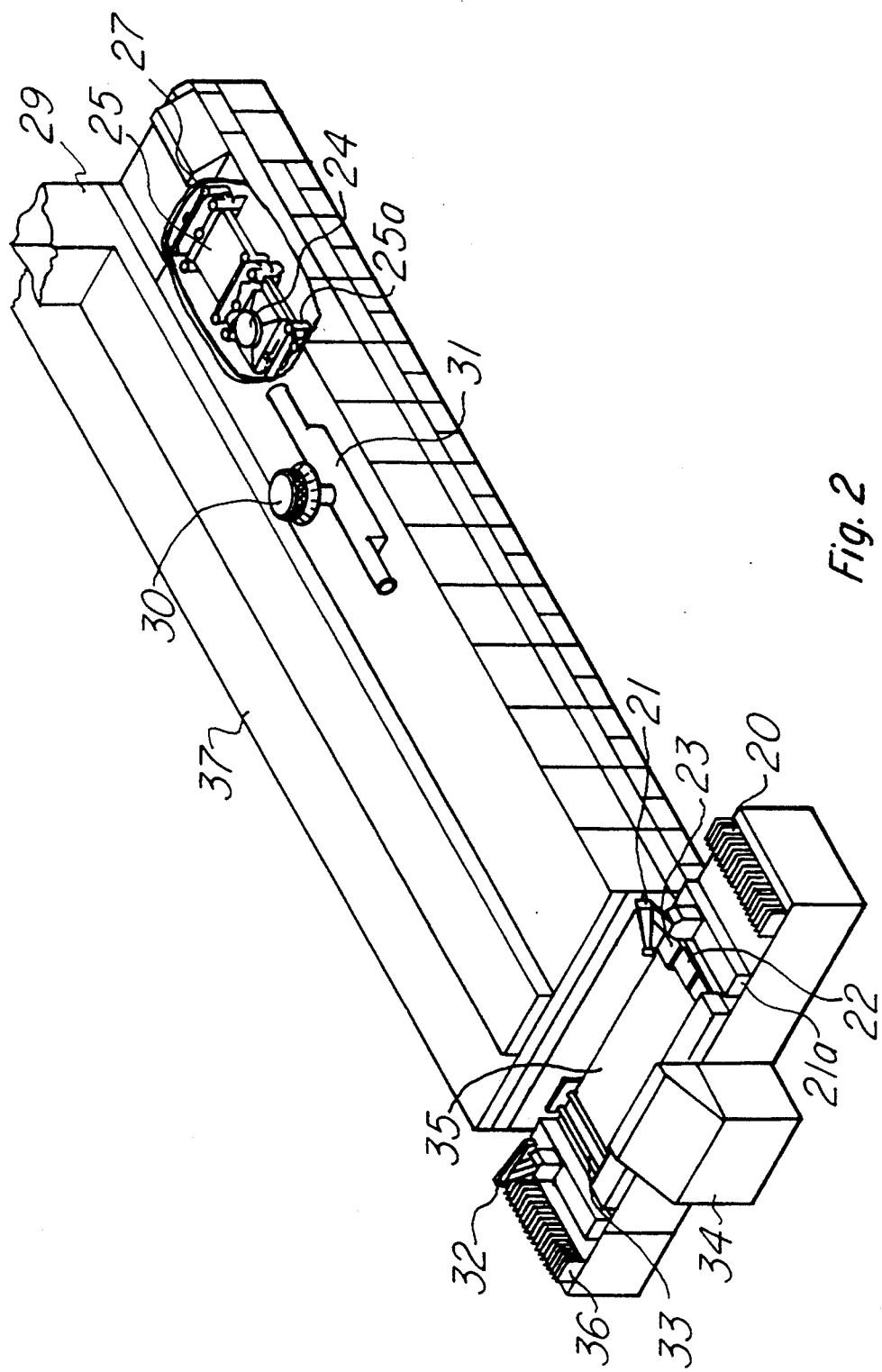
FIG. 2 illustrates a typical CCVD reactor of the present invention.

FIG. 2 is a more detailed illustration of a continuous chemical vapor deposition reactor. A plurality of wafer cassettes 20 are located along and adjacent to a robotic arm 21 which moves along a track 21a. The track allows the robotic arm 21 to move adjacent each of a plurality of wafer cassettes so as to permit the robotic arm to access each wafer in each cassette.

The robotic arm lifts a wafer from a cassette and places it in a carrier 22 at the entrance to the reactor. The entrance 23 to the reactor is a seal joint to prevent gases in the reactor from exiting from the reactor.

At the entrance, and before the carrier enters the reactor a vacuum pick-up arm (not illustrated) lifts the lid from the carrier to allow the robotic arm to place a semiconductor wafer into the carrier. After the semiconductor is placed into the carrier the carrier lid is replaced and the carrier is indexed through the reactor and the plurality of chambers that make up the reactor.

The carrier is indexed through the reactor and chambers using the length of the carrier and at least one spacer bar between each carrier. As each carrier is indexed into the reactor, each preceding carrier is moved to the next reactor chamber. The indexing is continuous, and as the carrier exits from the last reaction chamber is moved through the return path of the reactor to the entrance opening in the reactor, where the lid of the carrier is removed by a return lid pick-up (not illustrated). Tracks 33, which extend through the reactor, are used for moving the carrier through the reactor. A robotic arm 32 mounded on track 32a removes the semiconductor wafer from the carrier and places it in a wafer cassette 36.

The reactor is divided into a plurality of quartz reactor chambers 25. The reaction chambers 25 are joined by a junction 25a through which is introduced the process gases and from which the used gases are exhausted. Positioned over each reaction chamber is a heater block 24, used to heat the reaction chamber to a desired temperature. Water to cool the lamp housing is introduced through though inlet 26.

Each junction 25a has at least one exhaust tube 27 for removing exhaust gases from the reaction chambers. The exhaust gases are directed through a burn-off tube 31 to the gas burner 30.

The entire reactor is shrouded in an enclosure 37, and an air duct 29 is provided to circulate and exhaust gas-/air from inside the system shroud.

Figure 3:
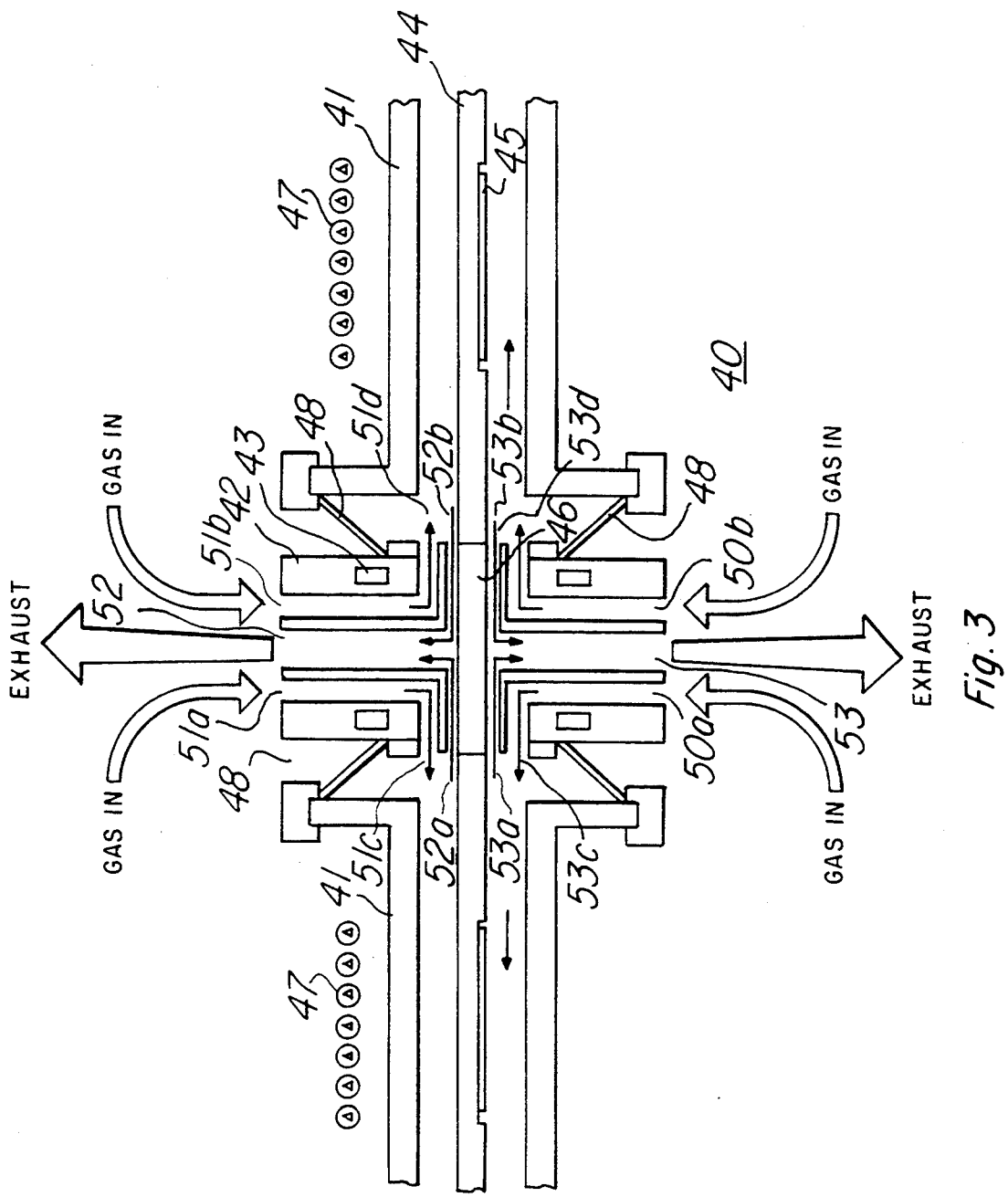
FIG. 3 is a cross-sectional view of two reaction chambers joined by a junction.

FIG. 3 illustrates a junction 40 between reactor chambers, showing the input and exhaust gas flow, and the path of the carrier in the chamber.

Each junction is a metal junction and connects consecutive quartz chambers, and may have either air or water cooled walls with the cooling medium flowing through ducts 43 within the walls. Each junction exhausts the gases from the reactor chambers which it connects.

In one embodiment of the invention, alternate junctions are used to introduce process gases into the reaction chamber, and in a second embodiment all junctions are used to introduce gases into the reaction chamber.

As illustrated in FIG. 3, gases for the upper portion of the reaction chamber 40 are introduced into the junction through inlets 51a and 51b, and flows into the reaction chambers through openings 51c and 51d. Process gases are introduced into the lower portion of the reactor chamber 40 through junction gas inlets 50a and 50b, and the gases flow into the chambers through openings 50c and 50d. The junction serves as a manifold for gas inlets and exhaust outlets.

To exhaust gases from the reaction chamber, the junction uses a combination of the positive pressure of the gas, the slight vacuum in the exhaust manifold, and an adjustable damper (not illustrated) in the exhaust manifold. The pressure of the gases in the reaction chamber results in flow of gas out of the chamber into the junction and into the exhaust outlet. Upper exhaust outlet receives exhaust gases through exhaust inlets 52a and 52b. The lower exhaust outlet 53 receives exhaust gases through exhaust inlets 53a and 53b.

The reaction chamber may be connected to the junction by a quartz-to-metal seal, by a metal flange or by high temperature material illustrated at 48 in FIG. 3.

The reaction chamber 41, where the actual reaction occurs is a generally rectangular quartz chamber. The interior of the quartz chamber is divided into upper and lower sections by the carrier 44 and spacer 46. The carrier or wafer carrier slides along two quarts rods or tubes (not illustrated in FIG. 3) during indexing of the carrier through the plurality of reactor chambers and through each junction between reactor chambers.

Quartz is used in the chambers to transmit heat from lamps 47 located on at least one side of the reaction chamber. The lamps are used to heat the semiconductor wafer 45 in carrier 44 to the desired reaction temperature.

The semiconductor wafer carriers are made of graphite or graphite coated with silicon carbide to withstand the high temperatures of the reaction chambers and to distribute the heat evenly to the wafer being processed.

Figure 4:
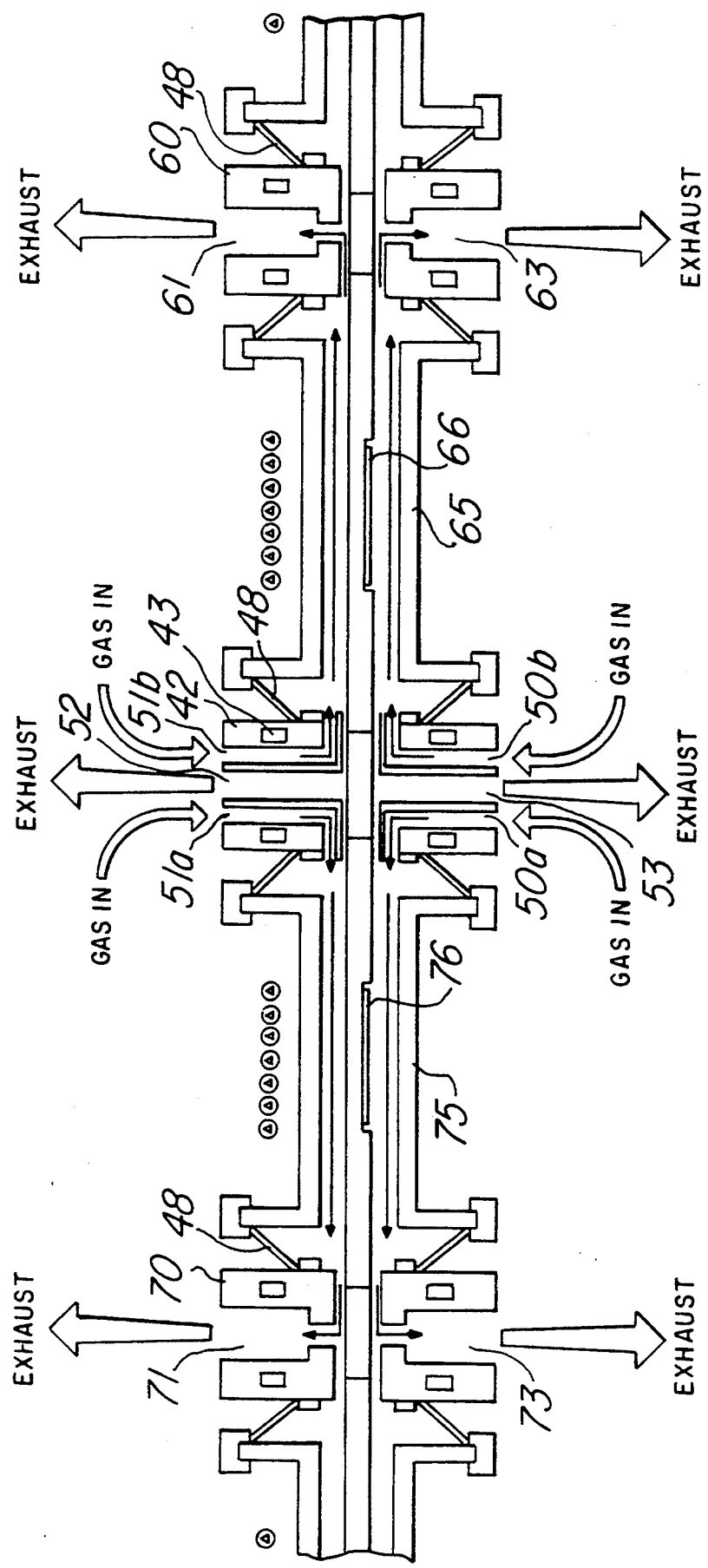
FIG. 4 is a cross sectional view of two reaction chambers and three junctions illustrating the gas flow between junctions.

FIG. 4 illustrates three junctions and the gas flow from one of the junctions to two other junctions. Junction 42 is the same junction as illustrated in FIG. 3. The other two junctions 60 and 70 are different in the respect that they are only exhaust ports, there are no gas inlets. Process gas is introduced into gas inlets 50a and 50b in junction 42. The gas introduced into inlet 50a flows through the reactor, across the surface of semiconductor wafer 75 and exhausts out exhaust port 73 in junction 70. In a similar manner, process gas introduced into gas inlet 50b of junction 42 flows through reactor 65, across the surface of semiconductor wafer 66, and out exhaust port 63 of junction 60. The gas introduced into junction 42 through inlets 51a and 51b also flows through respective reactors 75 and 65. The gas that flows through reactor 75 exhausts through exhaust port 71 in junction 70, and the gas that flows through reactor 65 exhaust through exhaust port 61 in junction 60. The gas flow through the reactors is shown by arrows through the reactors and to the exhaust ports.

Figure 5:
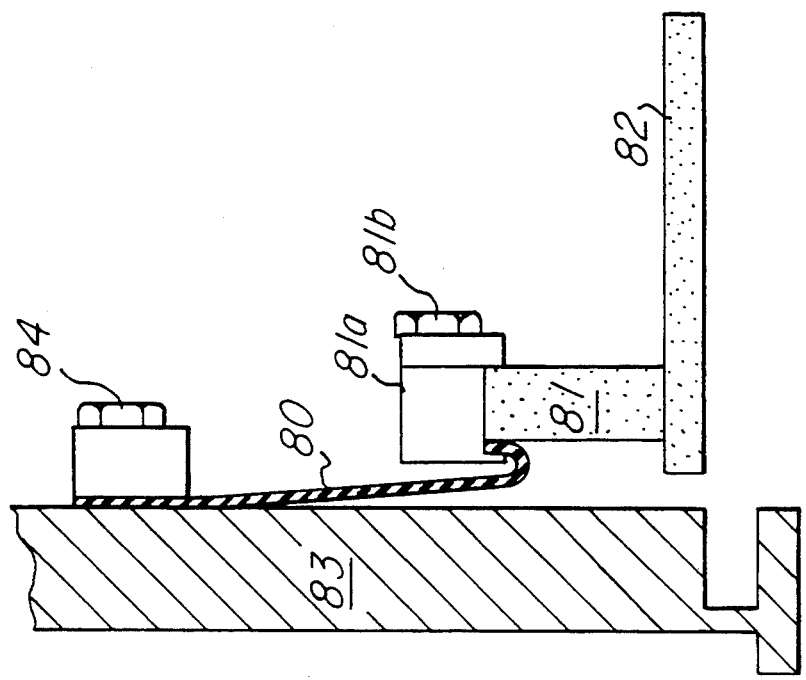
FIG. 5 illustrates a flexible seal used between a reactor chamber and the junction joining two reactor chambers.

FIG. 5 illustrates a method of sealing the interface between the reactor chamber 82 and junction 83 with a flexible seal. Flexible seal 80, which is representative of seal 48 illustrated in FIG. 4, is attached to the flange 81 of the reaction chamber 82 with a clamp 81a tightened by bolt 81b. The other end of the seal material is clamped to the junction 83 with bolt-clamp assemble 84. The seal may be any flexible high temperature material, for example silicone. This method of sealing the interface between the junction and reactor chamber provides minimal constraints on the reaction chamber. The use of elastic material allows freedom of motion in all directions and virtually eliminates reactor chamber stress due to mounting and thermal expansion during heating of the reactor chamber.

Figure 6:
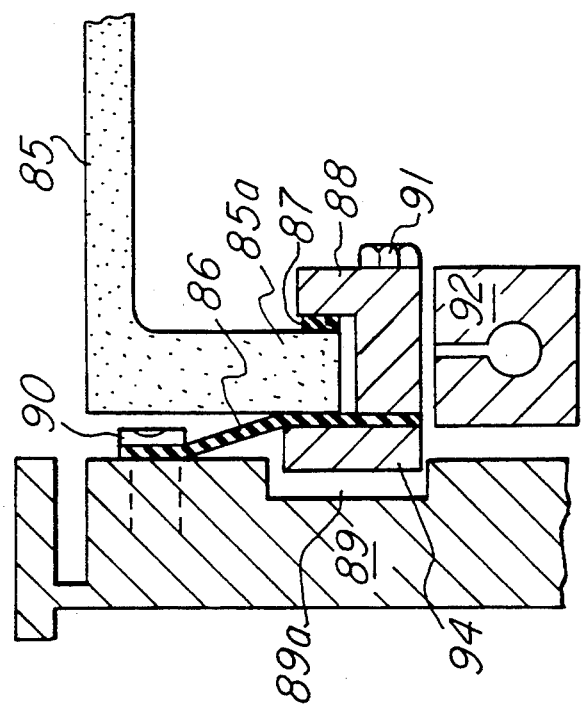
FIG. 6 illustrates another embodiment of a flexible seal.

FIG. 6 illustrates another embodiment of a flexible seal between the junction and reactor chamber. A seal is formed between junction 89 and quartz chamber 85 by flexible seal 86. One end of the seal is clamped to the flange 85a of chamber 85 by clamp-assembly 88,91 and 94. The seal is clamped to and held in place by tightening clamp part 94 against seal 90 and clamp part 88 and chamber flange 85a. A cushion/spacer is placed between clamp part 88 and flange 85a to prevent the clamp from bearing directly on the quart chamber flange. The flexible seal 86 is clamped to the junction 89 by screw-clamp 90.

An air bearing support 92 may be used to support the weight of the quartz reaction chamber and the graphite susceptor therein.

A pocket 39a may be provided in junction 89 to nest the clamping flange 94 during assembly and disassembly, and provides clearance for removal of the chamber after outer clamp bolt 90 is removed.

Figure 7:
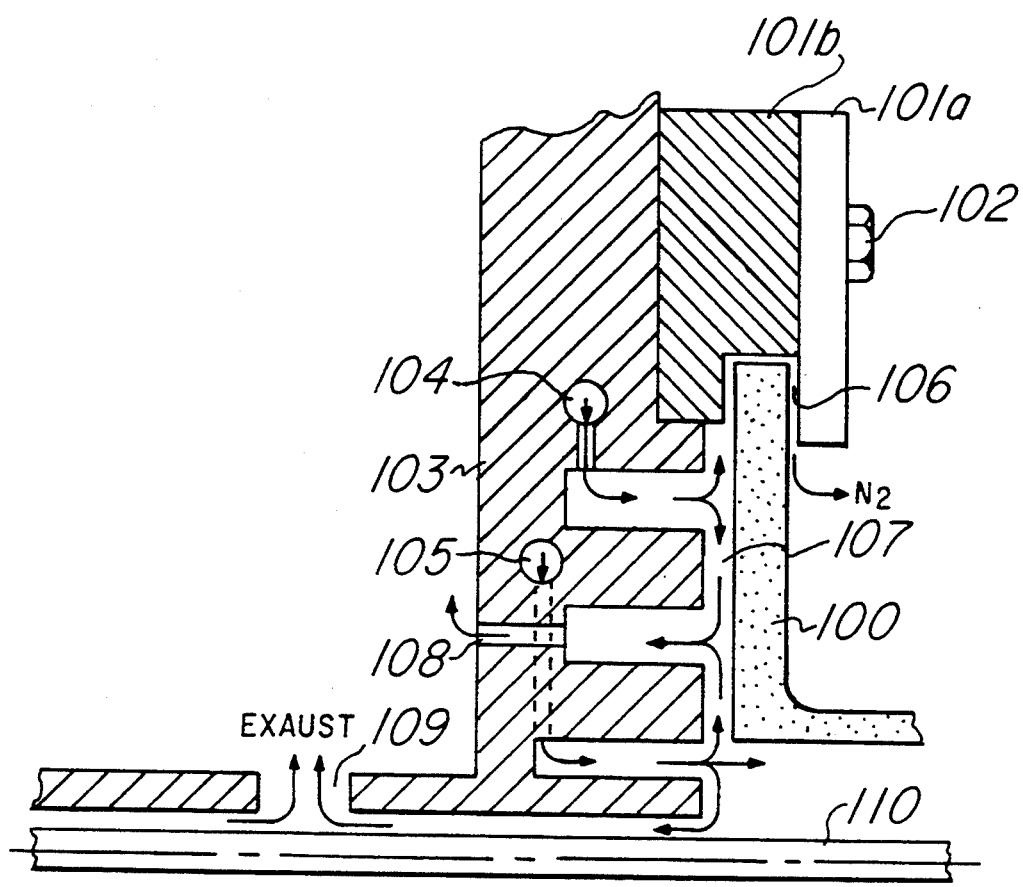
FIG. 7 illustrates a seal between a reactor chamber and a junction using gas flow and pressure differentials.

FIG. 7 illustrates a method of forming a gas seal between the reactor chamber 100 and the junction 103. The quartz chamber 100 is held against the junction 103 by clamp assembly made up of parts 101b, 101a, and bolt 102. The interface 106 between the clamp and the quartz chamber is not a hermetic seal. An inert purge gas such as nitrogen is introduced into gas plenum 104. The nitrogen flows out interface 106 and through opening 107 between the quartz chamber 100 and junction 103 to exhaust port 108. Reactive process gases such as Silane, $H_2$, and HCL are introduced through inlet 105 and flow into the reactor chamber over susceptor 110 and out exhaust port 109 into the exhaust plenum.

The reactive process gas also flows through the reactor chamber to the exhaust at the junction (not illustrated) at the far end of the reaction chamber. The pressure of the inert gas introduced into the junction/chamber interface 107 is greater than that of the reactive gas introduced through inlet 105 such that the reactive gas must flow into the reactor chamber, thus sealing the environment outside the reactor chamber from the reactive gases.

The method of sealing the reactive gases from the environment outside the reactor chamber illustrated in FIG. 7 permits completely stress free mounting of the quartz chamber and reduces breakage of the quartz chamber caused by ordinary quartz mounting constraints.

FIGS. 5, 6 and 7 illustrate only half of the cross section of the junction and quartz chamber. A typical cross-section view of the reaction chambers and junctions is illustrated in FIG. 4. The low portion of the junction and quartz chamber illustrated in FIGS. 5, 6 and 7 have gas seals as illustrated in FIG. 4 such that reactive gases introduced into the quartz chamber below the susceptor are also sealed from the environment around the reactor by the pressure differential between an inert gas and the reactive gases used in the reactor.

What is claimed:

1. A method for preventing reaction gases within a reaction chamber from escaping to the atmosphere through an interface between said reaction chamber and a reaction chamber junction, said method comprising the steps of:

introducing a reaction gas through a first gas inlet located in said reaction chamber junction into said reaction chamber at a first pressure;

introducing a second gas through a second gas inlet located in said reaction chamber junction into said reaction chamber between said first gas inlet and said interface, said second gas being introduced at a second pressure higher than said first pressure; and exhausting a portion of said second gas and a portion of said first gas through an exhaust port located between said first gas inlet and said second gas inlet.

2. The method according to claim 1, wherein said second gas is an inert gas.

3. A method for use in a continuous chemical vapor deposition reactor having at least one reaction chamber open at two ends, and wherein each open end of the reaction chamber is connected to a reaction chamber junction, said method for sealing the reaction chamber from the atmosphere at an interface where an open end of the reaction chamber is attached to a reaction chamber junction, said method comprising the steps of:

introducing a reaction gas through a first gas inlet located in said reaction chamber junction into said reaction chamber; and introducing a second gas through a second gas inlet located in said reaction chamber junction into said reaction chamber between said first gas inlet and said interface, said second gas being introduced at a pressure higher than the pressure of said reaction gas at said first gas inlet.

4. The method in accordance with claim 3 wherein said second gas is an inert gas.

5. The method in accordance with claim 3 further including the step of exhausting a portion of said second gas and a portion of said first gas through an exhaust port located in said reaction chamber junction between said first gas inlet and said second gas inlet.

* * * * *